(12) United States Patent
Chung et al.

(10) Patent No.: US 9,862,006 B2
(45) Date of Patent: Jan. 9, 2018

(54) SYSTEMS FOR LEVITATING A METALLIC TRAY

(71) Applicant: SolarCity Corporation, San Mateo, CA (US)

(72) Inventors: Ben Chung, San Rafael, CA (US); Pablo Gonzalez, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/983,316

(22) Filed: Dec. 29, 2015

(65) Prior Publication Data

US 2017/0182521 A1    Jun. 29, 2017

(51) Int. Cl.

| | | |
|---|---|---|
| B08B 3/00 | (2006.01) | |
| B08B 3/02 | (2006.01) | |
| B65G 13/02 | (2006.01) | |
| B65G 39/08 | (2006.01) | |
| H01L 31/18 | (2006.01) | |
| H01L 21/677 | (2006.01) | |
| H01L 21/67 | (2006.01) | |

(52) U.S. Cl.
CPC .............. *B08B 3/022* (2013.01); *B65G 13/02* (2013.01); *B65G 39/08* (2013.01); *H01L 21/67051* (2013.01); *H01L 21/67709* (2013.01); *H01L 31/1876* (2013.01)

(58) Field of Classification Search
None
See application file for complete search history.

(56) References Cited

U.S. PATENT DOCUMENTS

| | | |
|---|---|---|
| 4,624,617 A | 11/1986 | Belna |
| 5,180,048 A | 1/1993 | Kawada et al. |
| 5,881,649 A | 3/1999 | Hasegawa et al. |
| 5,890,580 A | 4/1999 | Hashimoto et al. |
| 5,906,262 A | 5/1999 | Miki |
| 6,068,755 A | 5/2000 | Matsuda et al. |
| 6,679,671 B2 | 1/2004 | Blonigan et al. |
| 7,351,292 B2 | 4/2008 | Evers et al. |
| 7,472,786 B2 | 1/2009 | Komori |
| 7,597,186 B2 | 10/2009 | Chung et al. |
| 8,609,556 B2 | 12/2013 | Van Gerwen et al. |
| 8,900,976 B2 | 12/2014 | Jin et al. |
| 8,936,956 B2 | 1/2015 | Han |
| 2012/0017833 A1 | 1/2012 | Von Der Waydbrink et al. |
| 2013/0135603 A1 | 5/2013 | Binnard et al. |
| 2014/0014918 A1 | 1/2014 | Han |

FOREIGN PATENT DOCUMENTS

EP     1061557 B1     4/2007

*Primary Examiner* — Eric Golightly
(74) *Attorney, Agent, or Firm* — Kilpatrick Townsend & Stockton LLP (57) ABSTRACT

A system for processing solar cells is disclosed which includes a separation module for separating a processing frame from solar cells that are fed along a conveyance line. The processing frame can be separated without requiring manual lifting of the processing frame by feeding the processing frame and solar cells into a magnetic roller system. The magnetic roller system can gradually lift the processing frame away from the solar cells and divert the processing frame to a separate roller system. The solar cells can remain on the main conveyance line for further processing.

7 Claims, 10 Drawing Sheets

SYSTEMS FOR LEVITATING A METALLIC TRAY

BACKGROUND

Advances in photovoltaic technology and, thus, photovoltaic (PV) panels have helped solar energy gain mass appeal among those wishing to reduce their carbon footprint and decrease their monthly energy costs. Basic solar cells can be constructed from crystalline silicon (c-Si) and assembled into a PV module having a basic laminate structure. More advanced solar cells, such as the Triex® cell, are based on a breakthrough tunneling junction cell architecture. The hybrid technology incorporates N-type crystalline silicon substrates to enable good carrier lifetime and low light induced degradation, thin film passivation layers to produce high voltage, and a semiconductor tunneling oxide interface layer for excellent junction quality and temperature coefficient performance.

Solar technology has made great strides in recent years from technological breakthroughs in increasing efficiency of PV modules. Such improvements are making solar energy a more viable energy source. In spite of these breakthroughs, cost per watt is perhaps the most determinative factor when deciding to implement a solar power installation. Unfortunately, PV panels are typically fabricated manually, which is a time-consuming and error-prone process that makes it costly to mass-produce reliable solar panels.

Thus, any aspect of the PV module manufacturing process that can increase throughput, and hence lower cost, has great importance for the viability of solar energy. Manufacturing tools, such as solar cell processing frames, for handling solar cells during the photolithography process, are one such aspect. These processing frames can help streamline the automated manufacture and handling of new technology solar cells, such as the Triex® cell. However, at a certain point in manufacture, use for these processing frames ceases and separation of the processing frame from the solar cells is required. This is a difficult matter, as the solar cells are very fragile and require minimal handling to avoid breakage.

BRIEF SUMMARY

A system is disclosed for processing solar cells. The system can include a module for rinsing solar cells and a module for separating solar cells from a processing frame. The frame is useful for handling solar cells prior to the rinsing step, primarily during a photolithography process that utilizes conveyors such as rollers, belts, and robotic arms. Such conveyors can primarily handle the frame to move the solar cells, and thus prevent damage to the fragile solar cells.

The frame may not include features that physically attach to solar cells, but can secure solar cells by way of a layer resist film that jointly covers the frame and solar cells. The photolithography process includes a number of steps, and eventually includes a step of exposing the resist film to a processing fluid, such as potassium carbonate, to soften and delaminate the resist film. After delamination of the film, the solar cells remain within the frame, but the frame is no longer securing the solar cells and requires removal.

A rinsing module can receive the processing frame and solar cells to rinse off the delaminated resist film. The rinsing module can include a roller system arranged beneath rinsing devices. The processing frame and solar cells can be advanced and rinsed through gaps in the rollers. After rinsing is complete, the solar cells need to be separated from the processing frame for drying and other processing steps for eventual assembly into a PV module.

Further advancement of the now rinsed processing frame and solar cells into a separation module causes separation of the processing frame from the solar cells. This is performed by using magnetic rollers that gradually lift and divert the processing frame onto a separate roller track. Because the solar cells are not ferromagnetic, the solar cells remain on a lower roller track. After separation, the processing frame can be removed from the separation module and reused for a new photolithography process, while the solar cells can either be set aside and stored for future use or directly processed for assembly into a PV module.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Figure 1:
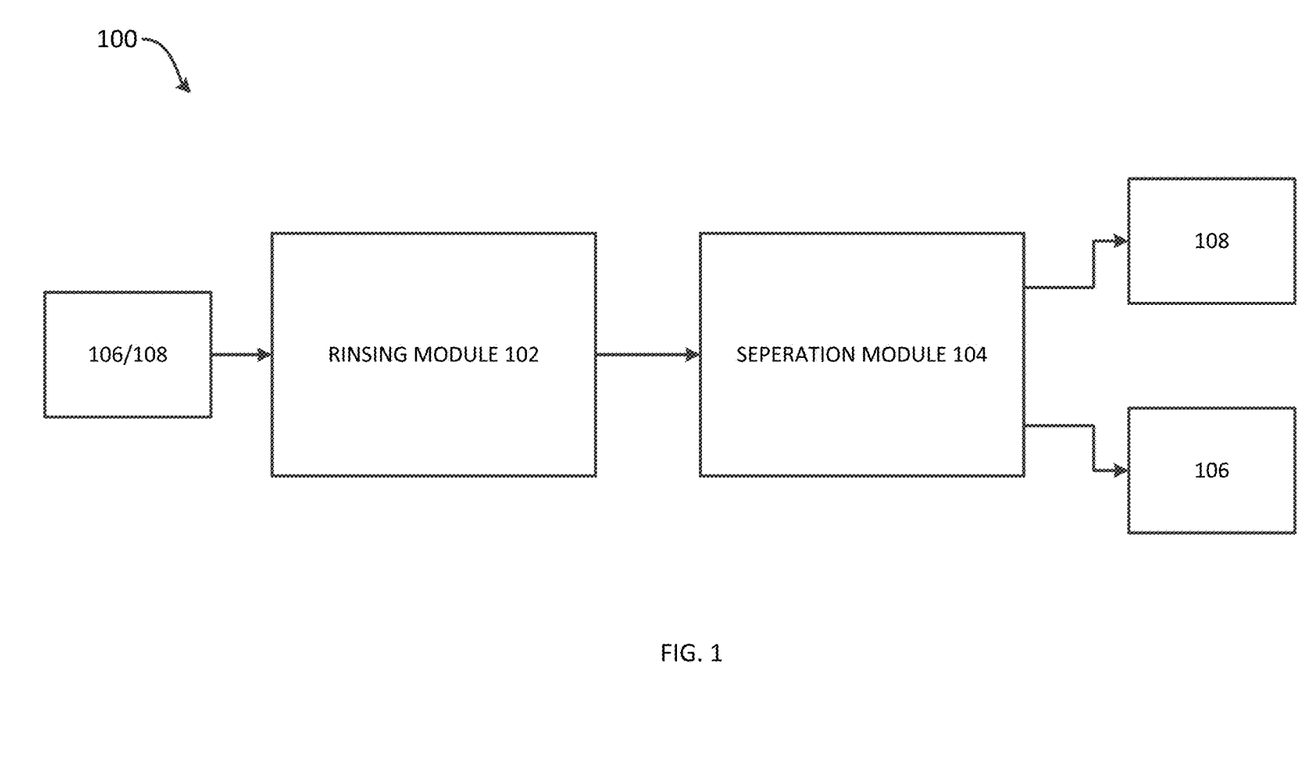
FIG. 1 shows a schematic diagram of a system for processing solar cells, according to some embodiments.

FIG. 1 depicts a schematic of system 100 for processing solar cells after a photolithography process. System 100 can be part of a greater solar cell processing system, or a stand-alone system. System 100 can include rinsing module 102 and separation module 104, and be specially adapted to handle processing frames, such as frame 106 shown in detail at FIG. 2. There, frame 106 is configured to capture twelve solar cells, but frame 106 can be configured to hold more or less solar cells than shown.

Figure 2:
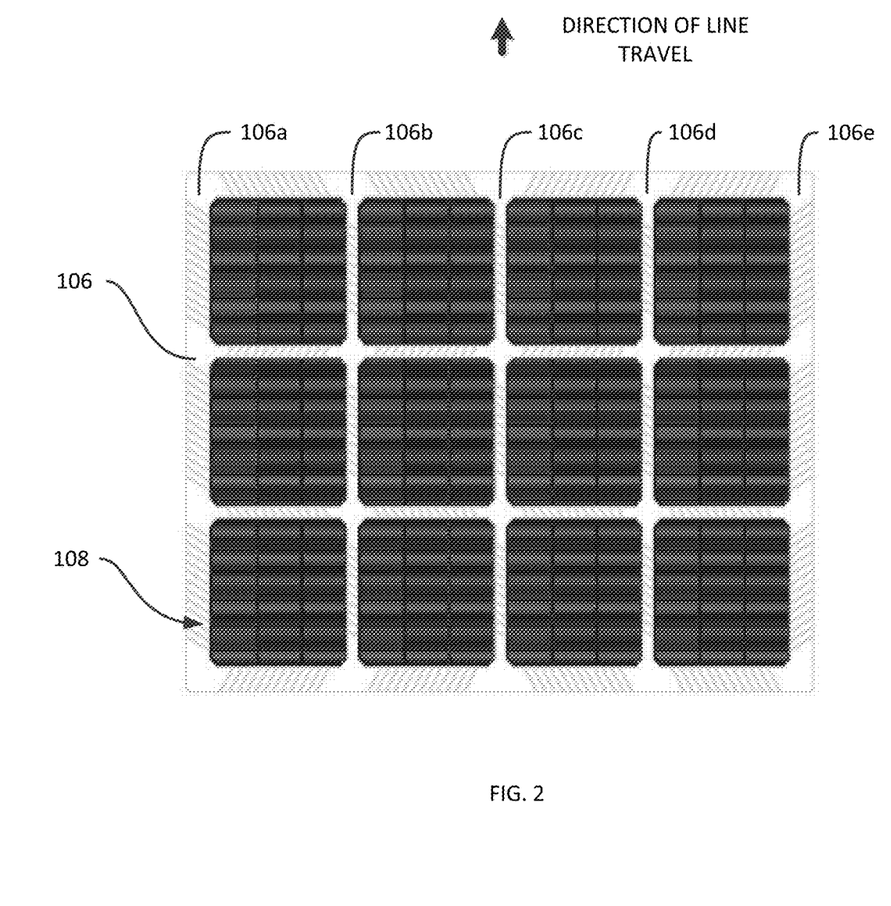
FIG. 2 shows a top view of a solar cell processing frame, according to some embodiments.

Frame 106 can be constructed from a sheet metal, such as a ferromagnetic stainless steel, and have openings for surrounding solar cells 108. Frame 106 does not have features that physically attach to solar cells 108, but can secure solar cells 108 by way of a layer resist film that covers frame 106 and solar cells 108. Frame 106 is not part of a PV module, but is used for handling solar cells 108 during the prior photolithography process.

Prior to arrival at system 100, solar cells 108 within frame 106 have undergone the photolithography process, which eventually includes exposing the resist film to a processing fluid, such as potassium carbonate, to soften and delaminate the resist film. Rinsing module 102 is used to rinse the softened resist film off of frame 106 and solar cells 108. Frame 106 and solar cells 108 are then transferred to separation module 104, which is configured to separate frame 106 from solar cells 108. After separation, solar cells 108 can undergo further processing, while frame 106 can be reused for a new photolithography process. The following description illustrates some examples of rinsing module 102 and separation module 104 that can be used with system 100.

Figure 3:
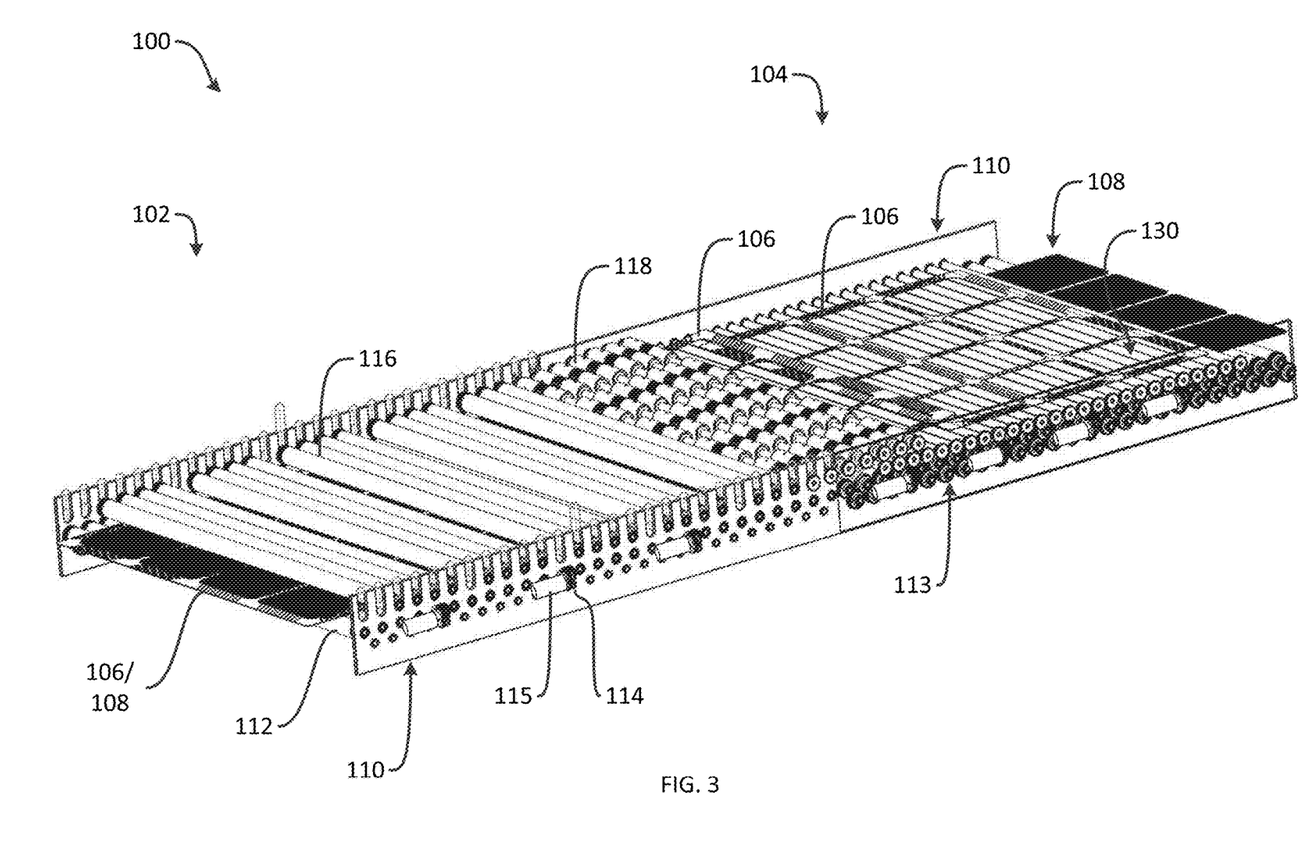
FIG. 3 shows a perspective view of a system for processing solar cells, according to some embodiments.
Figure 4:
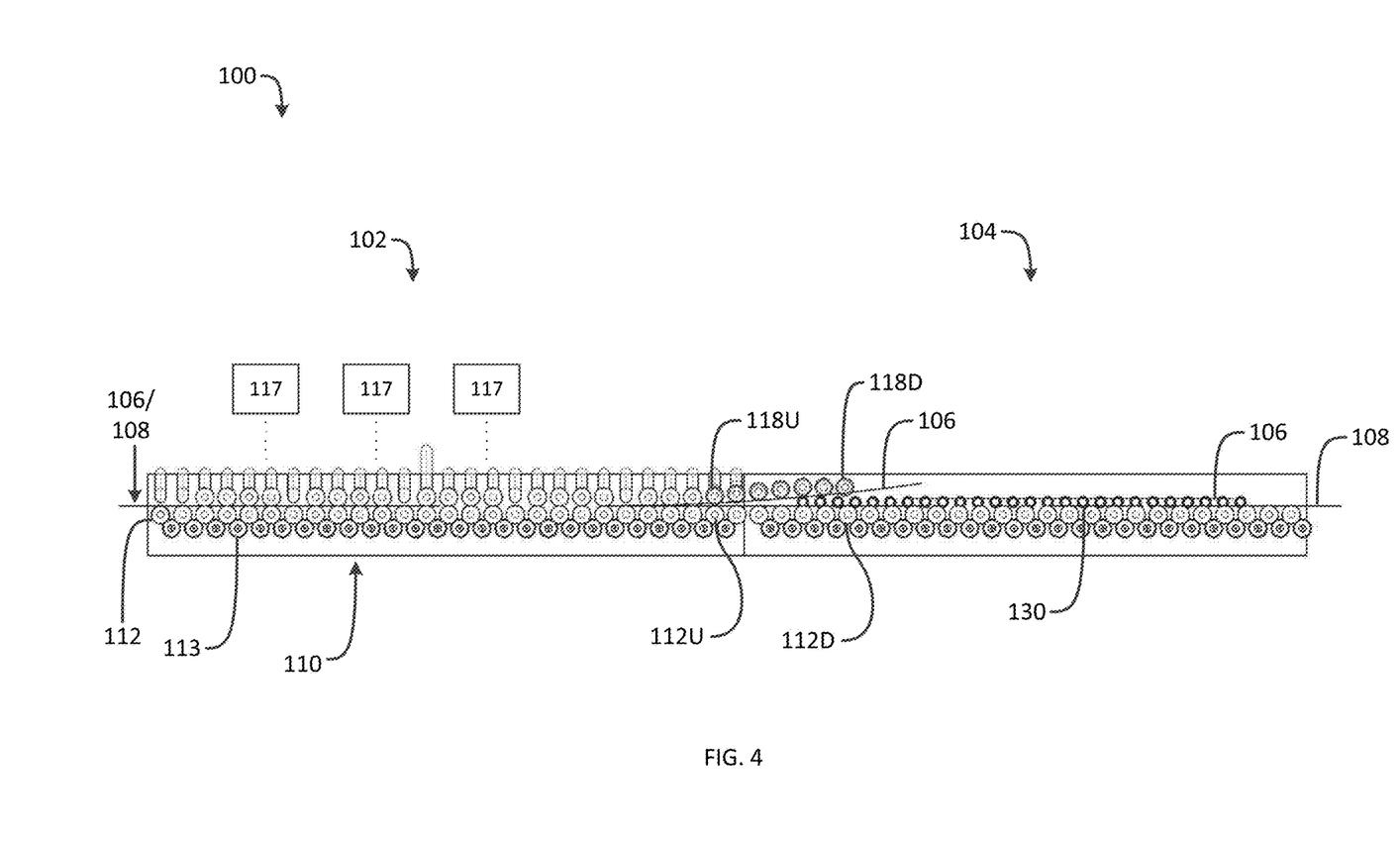
FIG. 4 shows a side view of the system of FIG. 3, according to some embodiments.

FIG. 3 shows a perspective view of an example of system 100, and FIG. 4 shows a side view of system 100. System 100 includes frame rails 110 that run along a processing line. Frame rails 100 can be constructed from sheet metal or extrusions. It should be understood that frame rails 100 are shown floating, i.e., without additional supporting members such as a frame and enclosure, for the purpose of illustrating working details of rinsing module 102 and separation module 104, and to that end, frame rails 110 are shown to be transparent in some views. Hence, it should be understood that frame members 110 can be supported by a greater structure.

Between frame rails 110 are lower rollers 112, which are disposed throughout system 100 between rinsing module 102 and separation module 104. Each of lower rollers 112 can include a bearing supported shaft and a soft elastomer cylinder supported by the shaft. The elastomer cylinder can be composed of a soft but durable and chemically resistant material, such as silicone, which may be generically referred to as "rubber" in this disclosure. Ends of lower rollers 112 can be geared and coupled by other rollers to one or more coupling gears 113 to drive lower rollers 112 in unison.

Frame rails 110 support motor couplers 114 for directly coupling some of lower rollers 112 to electric motors 115. Due to the gear train system, not every lower roller 112 needs to be directly driven by an electric motor. However, how lower rollers 112 are mechanically driven is not particularly critical to this disclosure, and other ways of driving lower rollers 112 can be used, such as chains and belts. In the view shown at FIG. 4, lower rollers 112 are driven clockwise to move frame 106 and solar cells 108 from left to right.

Lower rollers 112 can also be driven counter clockwise to reverse direction of the line flow, in case of a disruption, or in the case of rinsing module 102 to comprehensively rinse frame 106 and solar cells 108 using a back and forth movement. As shown, lower rollers 112 of rinsing module 102 are gapped and thus driven separately from lower rollers of separation module 104, however, lower rollers 112 can also be in geared contact throughout system 100.

Also between frame rails 110 are upper rollers 116, which are disposed throughout rinsing module 102. Each of upper rollers 116 can include a bearing supported shaft and a soft elastomer cylinder supported by the shaft. The elastomer cylinder can be composed of a soft but durable and chemically resistant material, such as silicone, which may be generically referred to as "rubber" in this disclosure.

Ends of upper rollers 116 can be geared and coupled by other rollers to one or more of support motor couplers 114 and motors 115 to drive upper rollers 116 in unison. In the particular configuration depicted, each of upper rollers 116 is driven by a directly adjacent lower roller 112. However, how upper rollers 116 are mechanically driven is not particularly critical to this disclosure, and other ways of driving upper rollers 116 can be used, such as a belt or chain driven system.

Upper rollers 116 and lower rollers 112 are spaced at a distance from one another to allow for driving frame 106 and solar cells 108 in between. Due to the rubber cylinders of upper rollers 116 and lower rollers 112, upper rollers 116 and lower rollers 112 can contact each other, thus pressing frame 106 and solar cells 108 as they pass between upper rollers 116 and lower rollers 112. Alternatively a slight gap may be present between upper rollers 116 and lower rollers 112, such that very light contact is made with upper and lower surfaces of frame 106. In aspects, solar cells 108 may or may not be contacted by the upper rollers 116 as they pass through upper rollers 116 and lower rollers 112.

As shown at FIG. 4 only, rinsing module 102 can include rinsing devices 117 positioned above upper rollers 116. Rinsing devices 117 are configured to emit pressurized processing fluid over frame 106 and solar cells 108 as they pass through upper rollers 116 and lower rollers 112 to dislodge softened resist film. Accordingly, rinsing devices 117 can include electronically operated valves that couple nozzles to a pressurized fluid line. Operation of the valves causes fluid to express over frame 106 and solar cells 108 to cause the rinsing action required to dislodge the softened film.

Also between frame rails 110 are magnetic rollers 118, which can be disposed partially through separation module 102. Here, magnetic rollers 116 are positioned above lower rollers 112 about a transitory area between rinsing module 102 and separation module 104. Accordingly, it should be understood that the process of "separation" between frame 106 and solar cells 108 as disclosed herein can begin to occur at rinsing module 102. However, this separation process can also exclusively occur at separation module 104.

Figure 6:
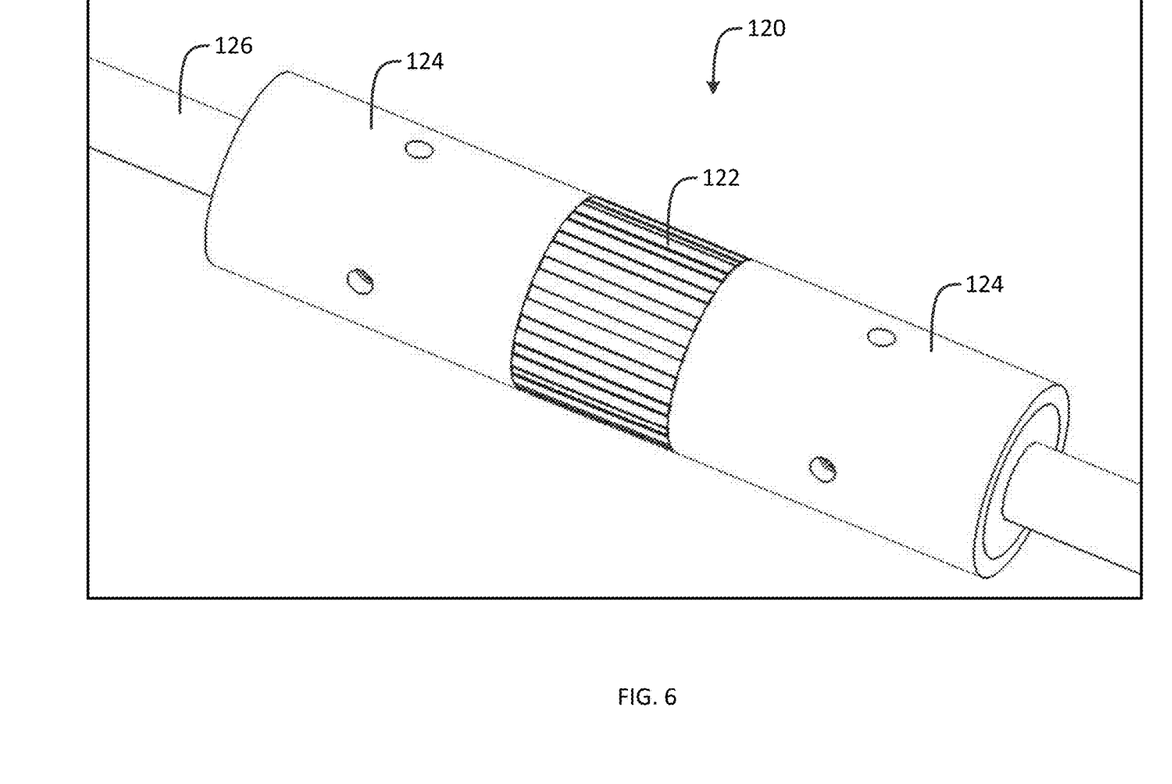
FIG. 6 shows a partial cross-sectional perspective view of an aspect of the system of FIG. 3, according to some embodiments.

Each of magnetic rollers 118 can include a bearing supported shaft and a plurality of magnetic roller portions 120. With attention to FIG. 6, magnetic roller portion 120 can include a cylindrical magnet carrier 122 flanked by elastomer cylinders 124 over shaft 126. Elastomer cylinders 124 can be composed of a soft, durable, and chemically resistant material, such as silicone, which may be generically referred to as "rubber" in this disclosure.

Figure 7:
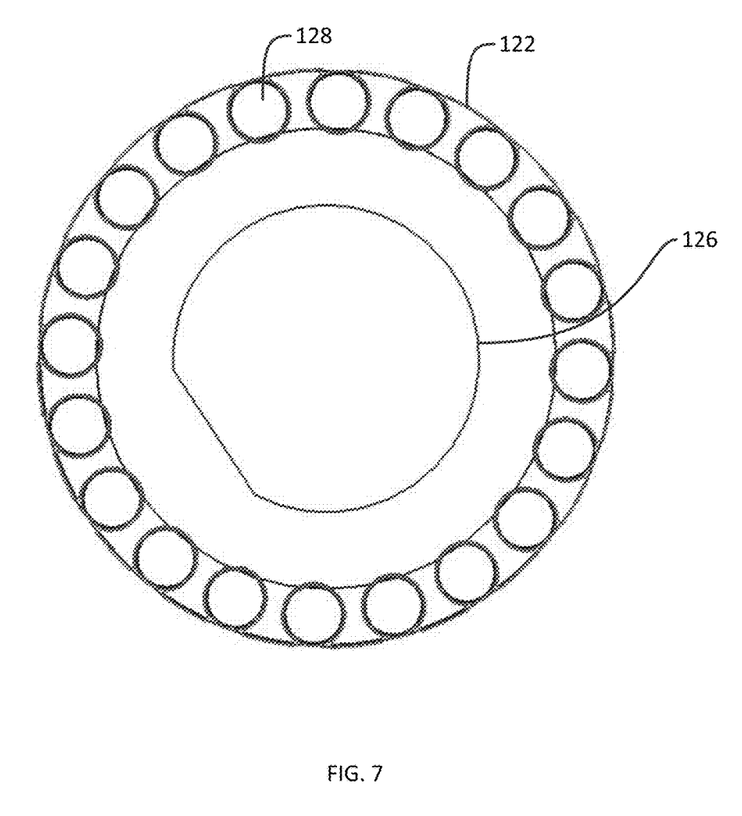
FIG. 7 shows a cross-sectional view of an aspect of the system of FIG. 3, according to some embodiments.

A cross-section of magnet carrier 122 is illustrated at FIG. 7. Magnet carrier 122 is configured to hold several cylindrical magnets 128, which can be powerful "rare-earth" type magnets. Here, twenty cylindrical magnets 128 are shown, but more or less can be used. Magnets 128 are diametrically magnetized such that north/south poles are diametrically opposed about the circumference of magnets 128 rather than at lateral ends of magnets 128. In alternative embodiments, magnetic roller portions may include electromagnets driven by a power source (not shown).

Generally a pole side of magnets 128 should be facing diametrically outward on magnet carrier 122 to provide the most magnetic force to frame 106. The specific north or south pole facing outward does not typically matter as both will attract frame 106. However, in some cases all or portions of frame 106 can be magnetic or carry embedded magnets to encourage attraction between magnets 128 and frame 106. In such embodiments, opposite poles of magnets 128 and frame should be coordinated for maximum magnetic attraction and to prevent magnetic repulsion. And in some embodiments, where magnets are present on frame 106, magnetic carrier 122 is not used, and simply a solid cylinder of ferromagnetic material is used to which the magnets on frame 106 attract.

The amount of magnetic roller portions 120 used per magnetic roller 118 is typically dependent on the amount of liftable ferromagnetic sections of frame 106 that are available, as well as the strength of the magnets used for carrier 122. As illustrated at FIG. 2, five sections 106a-e of frame 106 are provided for rollers 116 to lift, hence five magnetic roller portions 120 per magnetic roller 116 are illustrated at FIG. 3. However, more or less magnetic roller portions 120 can be used per magnetic roller 116 according to the structure and orientation of frame 106 with respect to the direction of travel.

With attention back to FIGS. 3 and 4, ends of magnetic rollers 116 can be geared and coupled by other rollers to one or more support motor couplers 114 and motors 115 to drive magnetic rollers 116 in unison. However, how magnetic rollers 116 are mechanically driven is not particularly critical to this disclosure, and other ways of driving magnetic rollers 116 can be used, such as a belt or chain driven system.

Figure 5:
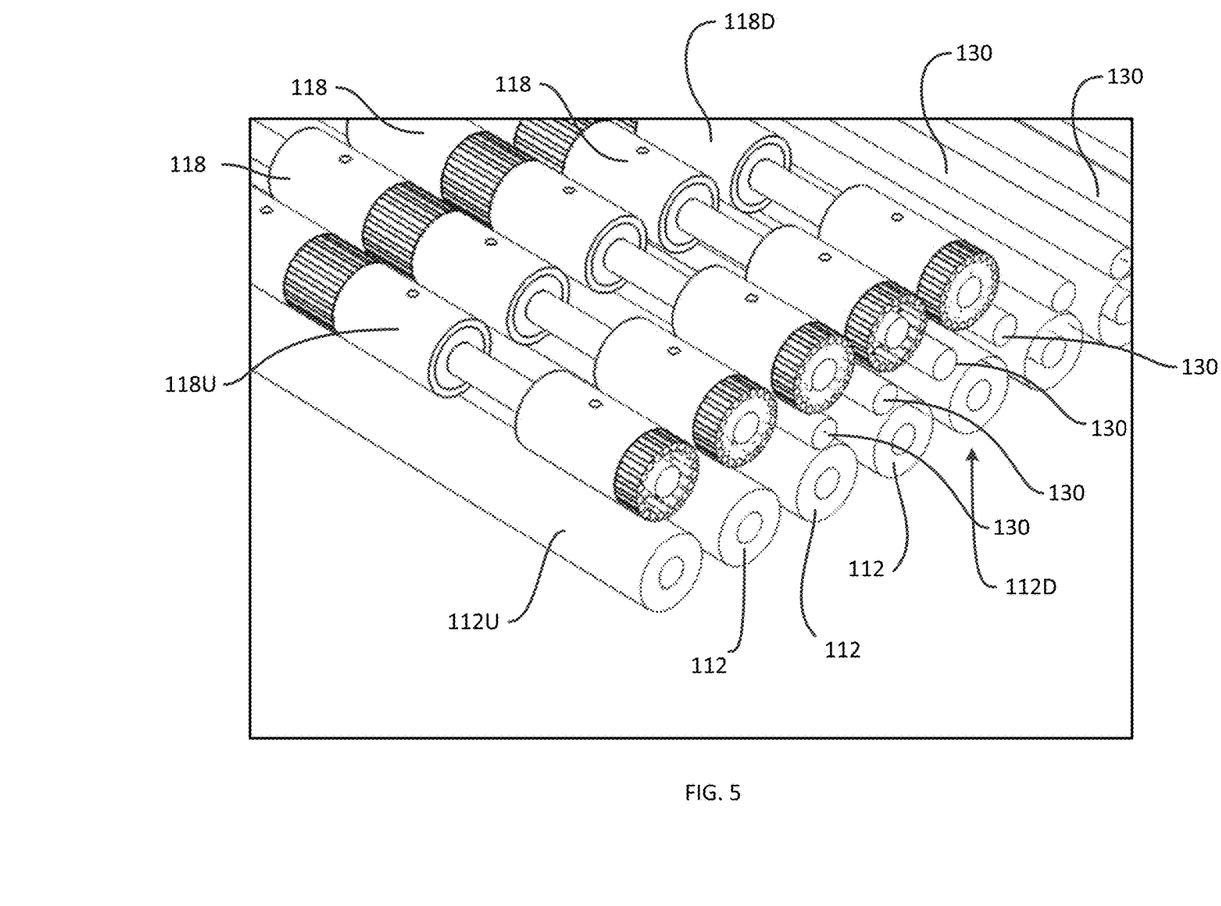
FIG. 5 shows a perspective view of an aspect of the system of FIG. 3, according to some embodiments.

Magnetic rollers 118 are arranged to incrementally increase in distance from lower rollers 112 in the left to right direction shown at FIG. 4. This is to enable a lifting process where frame 106 is lifted and separated from solar cells 108. Hence, gradual increased spatial separation from lower rollers 112 is required to affect that process. This is well illustrated at the partial cross-section at FIG. 5. Here, upstream magnetic roller 118U is spatially separated from lower roller 112U at a distance that is less than the spatial separation between downstream magnetic roller 118D and lower roller 112D. Each of magnetic roller 118 between upstream magnetic roller 118U and downstream magnetic roller 118D can incrementally increase in height until a desired distance is reached, at which point the height of magnetic rollers 118 can level out.

In addition, magnetic rollers 118 can transition from being located directly over lower rollers 112 to being directly over separation rollers 130, which also are mounted between frame rails 110 are disposed at least partially through separation module 102. Here, separation rollers 130 are positioned above lower rollers 112 at a portion of separation module 104. Each of separation rollers 130 can include a bearing supported shaft, but do not necessarily require soft elastomer coverings as per the other rollers because separation rollers 130 only handle bare frames 106.

Ends of separation rollers 130 can be geared and coupled by other rollers to one or more support motor couplers 114 and motors 115 to drive separation rollers 130 in unison. In the particular configuration depicted, each of separation rollers 130 is driven by a directly adjacent lower roller 112. However, how separation rollers 130 are mechanically driven is not particularly critical to this disclosure, and other ways of driving upper rollers 116 can be used, such as a belt or chain driven system. It can also be understood that separation rollers 130 may be replaced—fully or partially—in alternative embodiments with a non-rolling separation surface. In such case, frames 106 may be driven onto the non-rolling separation surface by the magnetic rollers 118. Frames 106 may then be removed from the line for reuse.

Figure 8:
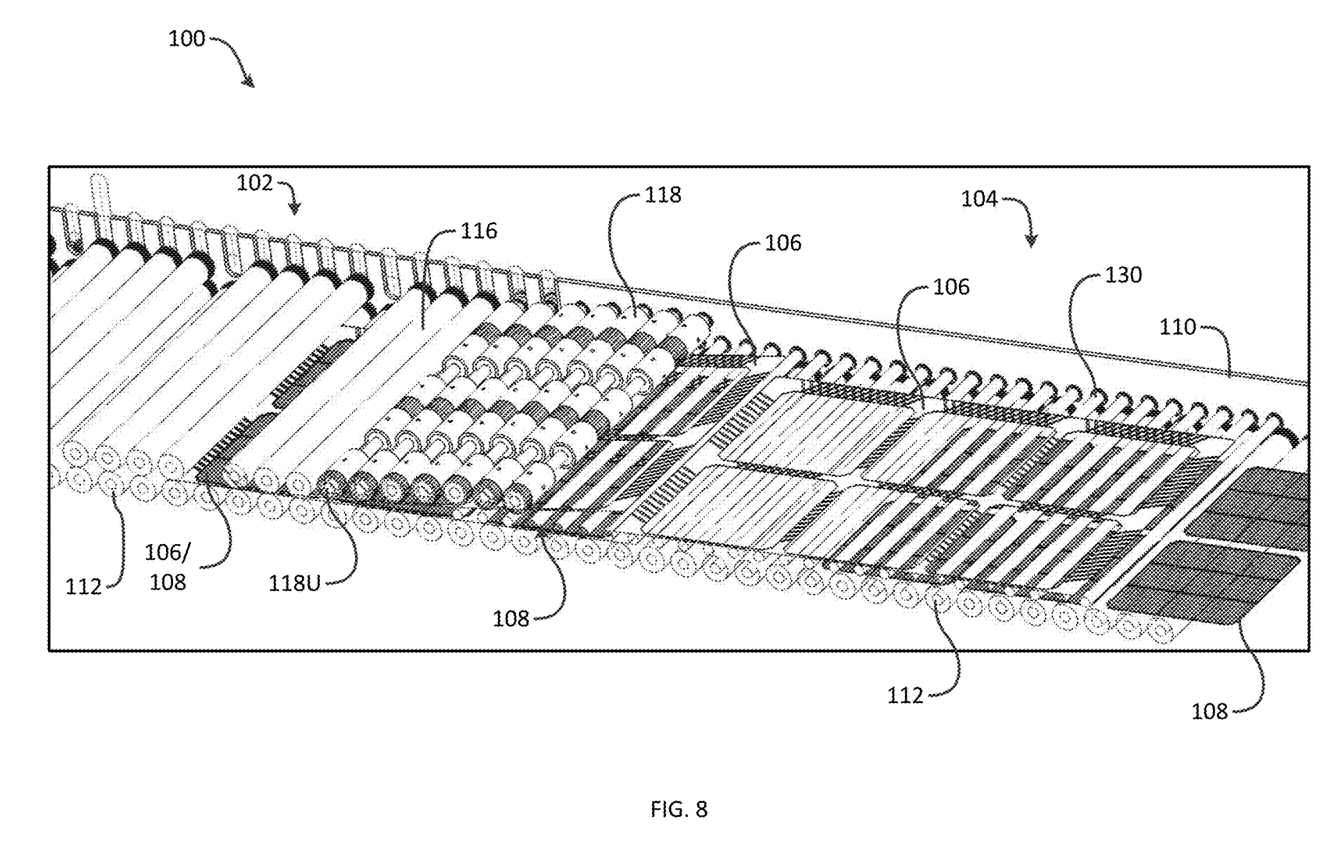
FIG. 8 shows a partial cross-sectional perspective view of the system of FIG. 3, according to some embodiments.

FIG. 4 illustrates a process to separate frame 106 from solar cells 108 using system 100, which is also depicted at FIG. 8. At the left hand portion of the figures, frame 106 and solar cells 108 are moved in a left to right direction by driving lower rollers 112 and upper rollers 116. At this point in the process, frame 106 and solar cells 108 have been completely rinsed and thus there is no film present that holds frame 106 and solar cells 108 together. Separation is initiated when frame 106 reaches upstream-most magnetic roller 118U. At that point, contact between frame 106 and magnets 128 of upstream-most magnetic roller 118U occurs, which initiates lifting of the forward most edge of frame 106.

This lifting is continued as frame 106 is fed past upstream-most magnetic roller 118U and placed into contact with remaining magnetic rollers 118. Magnetic rollers 118 are arranged to incrementally increase in distance from lower rollers 112 in the left to right direction. Hence, frame 106 is lifted and separated from solar cells 108, because solar cells 108 are non-ferromagnetic and hence not attracted to magnets 128.

Frame 106, without solar cells 108, continues to be lifted until the leading edge of frame 106 is moved above separation rollers 130. Continuous feeding of frame 106 past downstream-most magnetic roller 118D eventually causes separation of frame 106 from magnetic rollers 118 and disposition of frame 106 onto separation rollers 130. Frame 106, without solar cells 108, can then be lifted off separation rollers 130, either manually or by use of an automated processing equipment, for use in another photolithography process to create new solar cells.

As frame 106 is separated from solar cells 108, solar cells 108 continue to travel on lower rollers 112 towards the end of separation module 104 and underneath separation rollers 130. Preferably, in an aspect, separation rollers are distributed at a sufficient vertical distance from lower rollers 112 so as to avoid contact with the tops of solar cells 108. Solar cells 108 can continue along lower rollers 112 for transfer to a different processing module for eventual assembly into a PV module.

Figure 9:
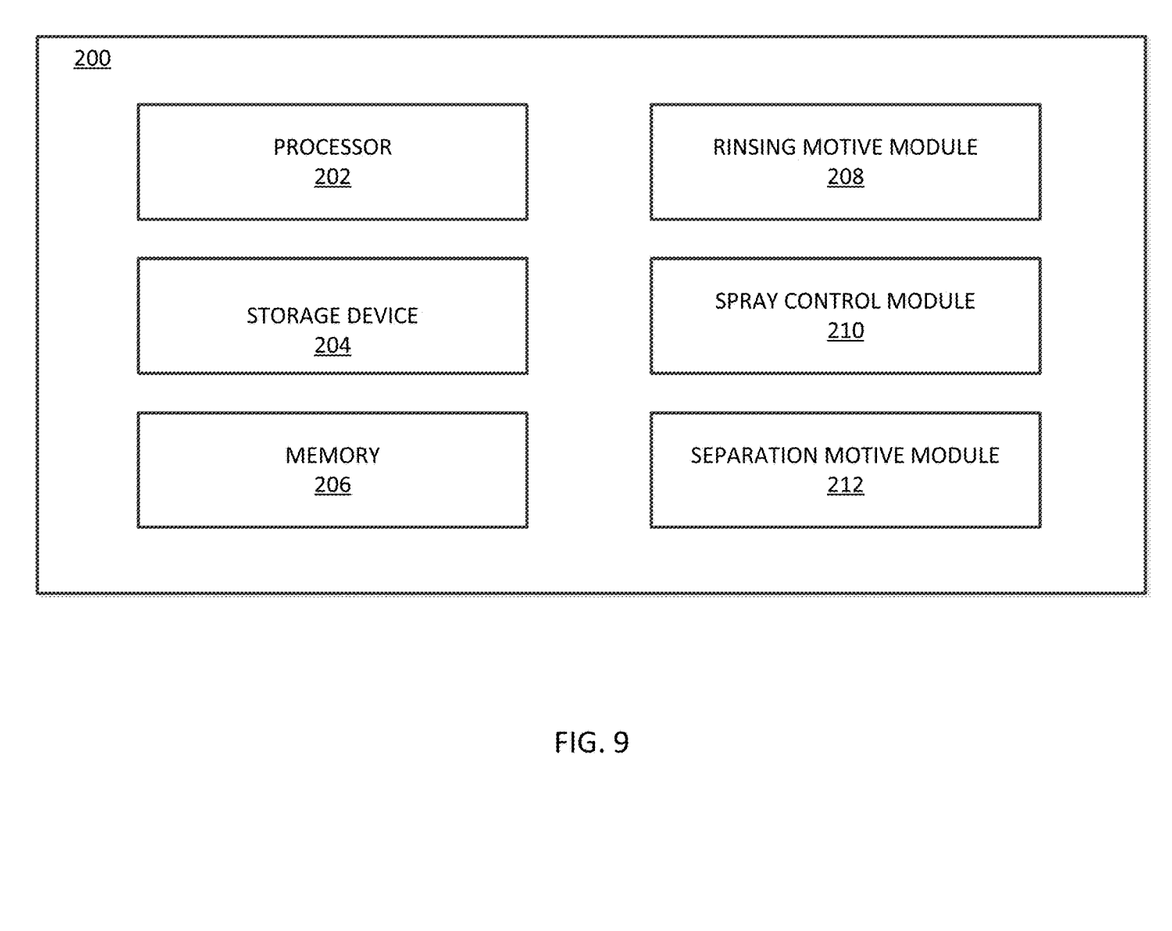
FIG. 9 shows a schematic of a control system for a system for processing solar cells, according to some embodiments.

FIG. 9 shows control system 200 that can facilitate operation of a system for rinsing and separating a solar cell processing frame and accompanying solar cells, such as system 100. Control system 200 can include a plurality of modules that may communicate with one another via a wired or wireless communication channel, such as a computer bus. Control system 200 may be realized using one or more integrated circuits, and may include fewer or more modules than those shown in FIG. 9. Further, control system 200 may be integrated in a computer system, or realized as a separate device that is capable of communicating with other computer systems and/or devices, such as the devices of systems 100. In an aspect, modules 208-212 may be implemented in software on a general purpose computer system. In further aspects, modules 208-212 may be any combination of special purpose hardware and software.

Control system 200 can include processor 202, storage device 204, and memory 206. Memory 206 can include a volatile memory (e.g., RAM) that serves as a managed memory, and can be used to store one or more memory pools. In some embodiments, storage device 204 can store an operating system, and instructions for monitoring and controlling rinsing and separating a solar cell processing frame and accompanying solar cells, such as the methods or portions of processes depicted at FIGS. 3, 4, 8, and 10.

Storage device 204 represents non-transitory computer-readable storage media that can store program code and/or data that provides the functionality of embodiments of the present disclosure. In some embodiments, memory 206 can include a number of memories including main random access memory (RAM) for storage of instructions and data during program execution and/or read-only memory (ROM) in which fixed instructions may be stored. Storage device 204 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art. In an aspect, a module as described herein may be or may include software or firmware stored in memory 206 and/or storage device 204. In another aspect, a module may comprise special-purpose hardware operating computer instructions to accomplish the tasks as set forth herein.

Control system 200 can include rinsing motive module 208, which controls operation of one or more devices associated with a motive driving of a rinsing module, which can be rinsing module 102, for example. Such devices, for example, can include motors for driving rollers, such as lower rollers 112, and feedback devices such as cameras and location sensors. For example, rinsing motive module 208 can operate motors to drive rollers holding a solar cell processing frame and accompanying solar cells. Rinsing motive module 208 can be accompanied by a vision system (e.g., one or more cameras) that can capture images of the solar cell processing frame and accompanying solar cells in association with the rinsing module and other aspects, to determine for example location of the solar cell processing frame and accompanying solar cells with respect to rollers of rinsing motive module 208. However, other types of sensor systems can be used in conjunction with rinsing motive module 208.

Control system 200 can include spray control module 210, which controls operation of one or more devices associated with operation of rinsing devices of a rinsing module, which can be rinsing devices 117 of rinsing module 102 for example. Such devices, for example, can include electrically operated valves and feedback devices such as cameras and location sensors. For example, spray control module 210 can operate valves to supply a rinsing fluid over a solar cell processing frame and accompanying solar cells for a set or dynamic period of time. Spray control module 210 can be accompanied by a vision system (e.g., one or more cameras) that can capture images of the solar cell processing frame and accompanying solar cells in association with the rinsing module and other aspects, to determine, for example, status of the rinsing process, a dynamic spray time, and/or location of the solar cell processing frame and accompanying solar cells with respect to rollers of spray control module 210. However, other types of sensor systems can be used in conjunction with spray control module 210.

Control system 200 can include separation motive module 212, which controls operation of one or more devices associated with a motive driving of a separation module, which can be separation module 104 for example. Such devices, for example, can include motors for driving rollers, such as lower rollers 112, and feedback devices such as cameras and location sensors. For example, separation motive module 212 can operate motors to drive rollers holding a separated solar cell processing frame and accompanying separated solar cells. Separation motive module 212 can be accompanied by a vision system (e.g., one or more cameras) that can capture images of the separated solar cell processing frame and accompanying separated solar cells in association with the separation module and other aspects, to determine for example location of the separated solar cell processing frame and accompanying separated solar cells with respect to rollers of separation motive module 212. However, other types of sensor systems can be used in conjunction with separation motive module 212.

Figure 10:
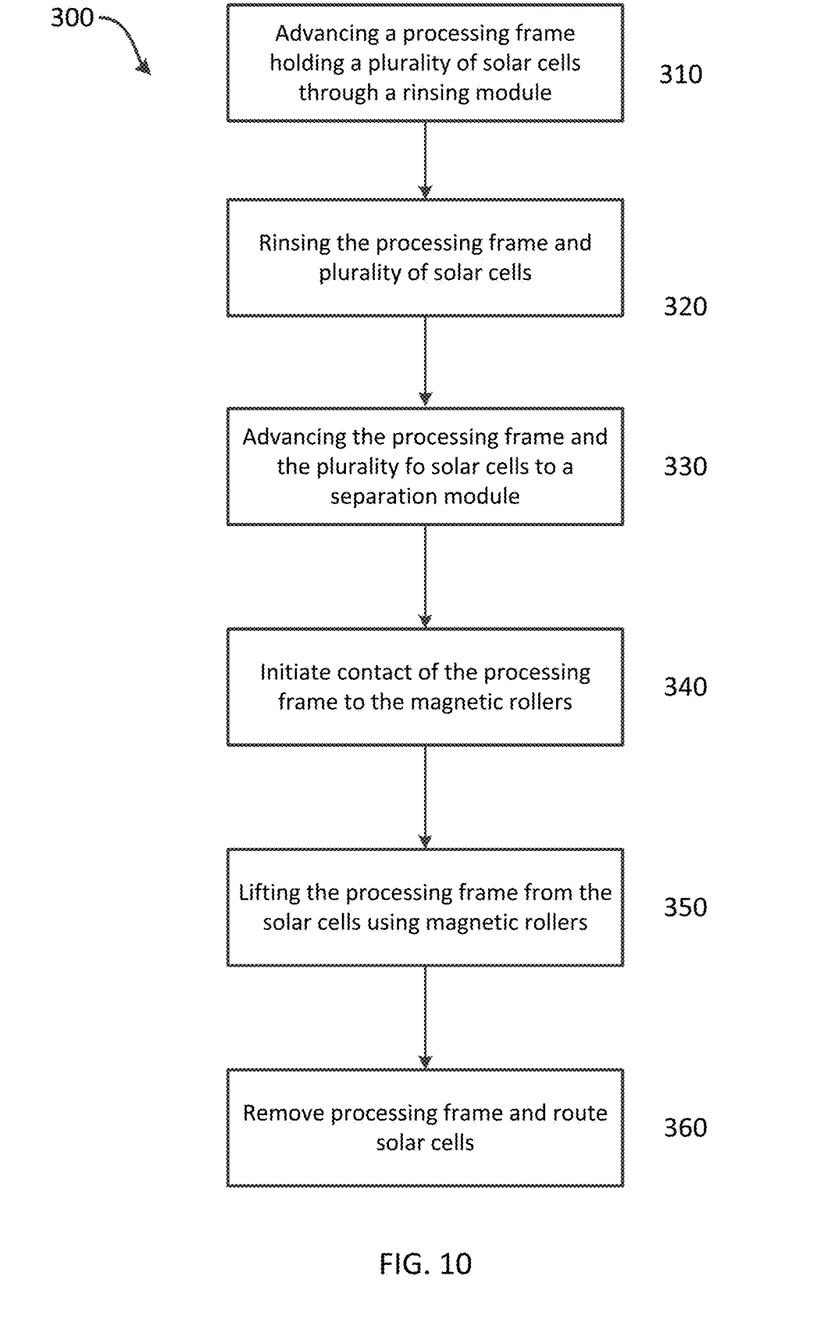
FIG. 10 shows a flow diagram of a method for processing solar cells, according to some embodiments.

FIG. 10 illustrates operations of method 300 for operating one or more systems for rinsing and separating processing frames and solar cells, such as operation of system 100 and/or control system 200. At operation 310 a processing frame, which can be frame 106, holding solar cells, such as solar cells 108, is advanced through a rinsing module. Advancement can be controlled by operation of motive portions of a rinsing module, such as control of motors 115 that drive lower rollers 112 and upper rollers 116 of rinsing module 102.

At operation 320, the processing frame and solar cells are rinsed to free them of softened film residue. Rinsing can be controlled by operation of rinsing devices, such as electronically controlled valves that open to release pressurized process fluid over the processing frame and solar cells. Examples of such rinsing devices include rinsing devices 117 of rinsing module 102.

At operation 330, the processing frame and solar cells can be advanced to a separation module, for example separation module 104. Advancement can be controlled by operation of motive portions of the rinsing module and separation module, such as control of motors 115 that drive rollers of rinsing module 102 and separation module 104.

At operation 340, separation of the solar cells from the processing frame can be initiated when the processing frame comes into first contact with magnetic rollers, such as magnetic rollers 118, to begin diverting the processing frame from the solar cells. This operation can be controlled by operation of motive portions of the rinsing module, such as control of motors 115 that drive rollers of rinsing module 102.

At operation 350, the processing frame is lifted from the solar cells, and thus separated, by continued advancement of the processing frame and solar cells through the separation module. This operation can be controlled by operation of motive portions of the rinsing module and separation module, such as control of motors 115 that drive rollers of rinsing module 102 and separation module 104.

At operation 360, the processing frame and solar cells can be separately handled for different operations. The separated processing frame can be manually or robotically retrieved from the separation module, and the solar cells can be routed to a new process for eventual assembly into a PV module.

Other variations are within the spirit of the present invention. Thus, while the invention is susceptible to various modifications and alternative constructions, certain illustrated embodiments thereof are shown in the drawings and have been described above in detail. For example, rubber material may cover the magnetic carrier 122 of the magnetic roller portion 120 in addition to or instead of being flanked by elastomer cylinders 124 over shaft 126. In another example, rinsing can take place separately or only over separation module 104, which can accordingly include rinsing devices 117 as well. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention. References to "one embodiment," "one aspect," "an embodiment," or "an aspect" are meant to indicate that at least one embodiment includes the described feature. However, these do not necessarily reference the same embodiment. One of skill will understand that various combinations of the features described fall within the scope of the disclosure herein.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system for processing solar cells, the system comprising:

a roller frame comprising a first frame portion a second frame portion;

a plurality of rollers arranged between and along the first frame portion and the second frame portion, the plurality of rollers for transferring a processing frame and a plurality of solar cells arranged within the processing frame, the plurality of rollers comprising:

a plurality of lower rollers;

a plurality of upper rollers arranged above a first portion of the plurality of lower rollers;

a plurality of magnetic rollers arranged above a second portion of the plurality of lower rollers and adjacent to the plurality of upper rollers; and a plurality of separation rollers arranged above a third portion of the plurality of lower rollers and below a portion of the plurality of magnetic rollers.

2. The system of claim 1, wherein the plurality of lower rollers and the plurality of upper rollers transfer the processing frame between them.

3. The system of claim 2, wherein the plurality of magnetic rollers are arranged to incrementally increase in distance from the lower rollers for lifting the processing frame off of the lower rollers, and thereby separating the processing frame from the solar cells.

4. The system of claim 3, wherein the plurality of lower rollers are arranged to carry the separated plurality of solar cells underneath the plurality of separation rollers.

5. The system of claim 4, wherein the separation rollers are arranged to receive the processing frame after it has been separated from the plurality of solar cells.

6. The system of claim 1, further comprising rinsing devices arranged above the upper rollers for rinsing the processing frame and plurality of solar cells.

7. The system of claim 1, wherein each first and second frame portion carries a plurality of gears for driving the plurality of rollers.

* * * * *